(12) United States Patent
Takizawa et al.

(10) Patent No.: US 6,404,017 B1
(45) Date of Patent: Jun. 11, 2002

(54) PROTECTION CIRCUIT FOR SEMICONDUCTOR INTEGRATED CIRCUIT THAT CAN DISCRIMINATE BETWEEN PROGRAM VOLTAGE AND STATIC ELECTRICITY

(75) Inventors: Toru Takizawa, Musashimurayama; Toshio Imai, Iruma, both of (JP)

(73) Assignee: Citizen Watch Co., Ltd., Nishitokyo (JP)

( * ) Notice: Subject to any disclaimer, the term of this patent is extended or adjusted under 35 U.S.C. 154(b) by 45 days.

(21) Appl. No.: 09/688,384

(22) Filed: Oct. 17, 2000

(30) Foreign Application Priority Data

Oct. 19, 1999 (JP) ............................................. 11-297025

(51) Int. Cl.$^7$ ................................................ H01L 23/62
(52) U.S. Cl. ........................ 257/355; 257/296; 257/298; 257/300; 257/357; 257/360
(58) Field of Search ................................ 257/355, 357, 257/360, 296, 300, 298

*Primary Examiner*—Fetsum Abraham
(74) *Attorney, Agent, or Firm*—Armstrong, Westerman & Hattori, LLP

(57) ABSTRACT

A current when static electricity intrudes is passed by a first circuit portion composed of a series circuit including a fuse element and a resistor until a program voltage is applied to a program voltage terminal, and the fuse element is fused when the program voltage is applied. A current for breaking the fuse element is passed when an N-type MOS transistor turns into a second breakdown state by a gate voltage from a second circuit portion.

18 Claims, 7 Drawing Sheets

PROTECTION CIRCUIT FOR SEMICONDUCTOR INTEGRATED CIRCUIT THAT CAN DISCRIMINATE BETWEEN PROGRAM VOLTAGE AND STATIC ELECTRICITY

BACKGROUND OF THE INVENTION

1. Field of the Invention

The present invention relates to a protection circuit for a semiconductor integrated circuit equipped with a semiconductor non-volatile memory device, more specifically, to a protection circuit provided on a semiconductor integrated circuit to protect an internal circuit from static electricity intruding at a terminal to which a program voltage for writing into the memory device is applied.

2. Description of the Related Art

In a semiconductor integrated circuit equipped with a semiconductor non-volatile memory device (hereinafter, referred to as "memory device"), information is written into the memory device by a voltage higher than a power supply voltage. Especially, a memory device of a junction breakdown-type or a fuse element breakdown-type requiring a current for writing is supplied with a program voltage for writing from the outside, and a terminal (hereinafter, referred to as "program voltage terminal") for supplying the program voltage is provided.

Due to the existence of such a terminal, there is inevitably a possibility that static electricity intrudes at the terminal, and thus a protection circuit for protecting an internal circuit from the static electricity is provided.

The protection circuit, if composed of a diode or a transistor generally used as a typical circuit element, can not discriminate between static electricity and a program voltage which intrude at the program voltage terminal, resulting in operation even when the program voltage is supplied.

Further, the protection circuit is provided also in the case of the program voltage terminal being an input/output terminal of the internal circuit. In that case, the protection circuit is used in the state in which its input/output terminal is not supplied with a voltage higher than the power supply voltage from a power supply voltage terminal, and when a voltage higher than the power supply voltage is applied, the protection circuit operates accepting all the cases as static electricity mixing.

For example, it is assumed that the protection circuit is composed of a positive voltage protection diode for protecting the internal circuit from a static electricity of positive voltage and a negative voltage protection diode for protecting the internal circuit from a static electricity of negative voltage. It is conceivable that either static electricity of positive voltage or static electricity of negative voltage intrudes at the input/output terminal. When the static electricity of positive voltage intrudes therein, the protection circuit operates to pass the electricity to a GND terminal due to the forward characteristic of the positive voltage protection diode, and when the electricity of negative voltage intrudes therein, the protection circuit operates to pass the electricity to the power supply voltage terminal due to the forward characteristic of the negative voltage protection diode.

The configuration and operation of the conventional protection circuit as described above will be explained concretely here.

FIG. 9 is a circuit diagram showing the configuration of a semiconductor integrated circuit provided with the conventional protection circuit. This protection circuit is a circuit for protecting an internal circuit 9 from static electricity which intrudes at a program voltage terminal 4 and comprises a first circuit portion 1 and a second circuit portion 11.

The first circuit portion 1 comprises a positive voltage protection diode 14 connected between a GND line 8 and a program voltage line 10 in a forward direction as viewed from the program voltage terminal 4, and a negative voltage protection diode 16 connected between the program voltage line 10 and a power supply voltage line 12 in a backward direction as viewed from the program voltage terminal 4.

The second circuit portion 11 comprises a negative voltage protection transistor 18 connected between the GND line 8 and the program voltage line 10 in parallel with the positive voltage protection diode 14, and a positive voltage protection transistor 20 connected between the program voltage line 10 and the power supply voltage line 12 in parallel with the negative voltage protection diode 16.

A GND terminal 2 at the ground potential and an input/output terminal 3 of the internal circuit 9 are connected to the GND line 8. The program voltage terminal 4 which is a pad for supplying a program voltage and a memory device 50 are connected to the program voltage line 10. A power supply voltage terminal 6 for supplying a power supply voltage and an input/output terminal 7 of the internal circuit 9 are connected to the power supply voltage line 12.

The positive voltage protection diode 14 and the positive voltage protection transistor 20 are connected each other to protect the internal circuit 9 from static electricity of positive voltage which intrudes at the program voltage terminal 4. Further, the negative voltage protection diode 16 and the negative voltage protection transistor 18 are connected each other to protect the internal circuit 9 from static electricity of negative voltage which intrudes at the program voltage terminal 4. The memory device 50 is a memory device of a junction breakdown-type which requires a current for writing or a fuse element breakdown-type which is a type of being fused by a large current and connected between the GND line 8 and the program voltage line 10.

Meanwhile, a transistor has a PN junction as in a diode, and thus the transistor can be regarded as one diode. However, because of the existence of a gate terminal, the transistor (FET) is low in withstand voltage of the reverse junction to the PN junction as compared with the diode due to its configuration. The withstand voltage can further decrease in accordance with the voltage applied to the gate terminal.

More specifically, assuming that there is no second circuit portion 11 composed of the negative voltage protection circuit 18 and the positive voltage protection transistor 20 and thus the protection circuit composed of only the first circuit portion 1 as shown in FIG. 10, the transistor of the internal circuit 9 is often broken first. Assuming such a case, it is necessary to provide the second circuit portion 11 as in the protection circuit shown in FIG. 9.

Regardless of whether or not each of these protection circuits has the second circuit portion 11, it operates normally if the magnitude of the voltage applied to the program voltage terminal 4 is that of either the power supply voltage or the ground voltage.

However, a protection circuit comprising a typical diode or transistor as in the above-described conventional protection circuit can not discriminate between the static electricity and the program voltage which intrude at the program voltage terminal. Therefore, there is a problem that either the positive voltage protection diode 14 or the negative voltage protection diode 16 operates even when the program voltage greater than the power supply voltage is applied to the program voltage terminal 4, making it impossible to write into the memory device 50.

Further, in the case in which both of the power supply voltage and the program voltage are at negative voltage in the protection circuit shown in FIG. 10, when the program voltage is supplied to the program voltage terminal 4, a drawn current 53 flows in from the power supply voltage terminal 6 because the magnitude of the program voltage is greater than that of the power supply voltage. For this reason, there is also a problem that a current required for writing into the memory device 50 can not be obtained and, more than that, the internal circuit 9 malfunctions due to the change in power supply voltage.

If the protection circuit is configured to cope with a program voltage which can be applied thereto and operate only when static electricity with a different polarity (for example, positive voltage) from that of the program voltage intrudes at the program voltage terminal 4, the internal circuit 9 is protected from the static electricity (positive voltage), with the result that the protection circuit can operate effectively to either positive or negative static electricity. For a static electricity with a polarity (negative voltage) from which the internal circuit can not be protected, the power supply voltage is set at the same as the program voltage not to allow the protection circuit to operate.

This, however, results in an application of a voltage greater than a rated voltage from the power supply voltage terminal 6 to the internal circuit 9, and thus it is predictable that the above configuration brings about a undesirable situation for operation of a circuit element provided in the internal circuit 9, leading to a problem that the circuit element may be broken.

SUMMARY OF THE INVENTION

In consideration of the problems of the protection circuit for the semiconductor integrated circuit as described above, an object of the present invention is to resolve the problems, that is, an object is to make it possible to write normally when the program voltage is applied to the program voltage terminal of the semiconductor integrated circuit and to operate normally even when either the positive or negative static electricity intrudes therein to protect the internal circuit.

For achieving the above object, this invention is a protection circuit, for a semiconductor integrated circuit, connected between a GND line connected to a GND terminal of the semiconductor integrated circuit and a program voltage line connected to a program voltage terminal for supplying a program voltage for writing into a memory, including: a first circuit portion for passing a current generated by static electricity until the program voltage is applied to the program voltage terminal, and for breaking a connection between the GND line and the program voltage line when the program voltage is applied; a semiconductor device for passing a current to the first circuit portion for breaking the connection between the GND line and the program voltage line; and a second circuit portion for applying a voltage to the semiconductor device so that the semiconductor device passes the current to the first circuit portion for breaking the connection between the GND line and the program voltage line.

In the above-described protection circuit for a semiconductor integrated circuit, the first circuit portion is preferably constituted by connecting a resistor for suppressing the current generated by static electricity and a fuse element in series between the GND line and the program voltage line.

Further, the semiconductor device is preferably composed of an N-type MOS transistor for passing a current at a second breakdown to fuse the fuse element of the first circuit portion.

Furthermore, the second circuit portion is preferably configured to supply a gate of the N-type MOS transistor with a gate voltage for the N-type MOS transistor to pass the current at the second breakdown.

Moreover, the second circuit portion is preferably constituted by connecting a P-type MOS transistor and an N-type MOS transistor in series between the GND line and the program voltage line, so that a voltage obtained by dividing a voltage between the GND line and the program voltage line by the P-type MOS transistor and the N-type MOS transistor is taken as the gate voltage.

Further, in this invention, the fuse element is preferably configured such that top of a polycrystalline silicon film is covered with an insulating film having an opening portion for exposing part of the polycrystalline silicon film, a metal wiring film is formed from the top of the insulating film to the inside of the opening portion, and the metal wiring film formed on an inner wall face of the opening portion becomes a current concentration portion with a high resistance value.

In this case, the opening portion of the insulating film is preferably formed divided into two sides, a side for inputting current thereinto and a side for outputting current, and the number of opening portions on the inputting side is two or more.

Further, the fuse element may be composed of a metal wiring film provided with a fusion area which is thin and has a high resistance value, or composed of a polycrystalline silicon wiring film having a step portion, and a current concentration portion easy to fuse is formed in the step portion.

The above and other objects, features and advantages of the invention will be apparent from the following detailed description which is to be read in conjunction with the accompanying drawings.

DETAILED DESCRIPTION OF THE PREFERRED EMBODIMENTS

Hereinafter, preferred embodiments for carrying out a protection circuit for a semiconductor integrated circuit according to the present invention will be explained using the drawings.

Figure 1:
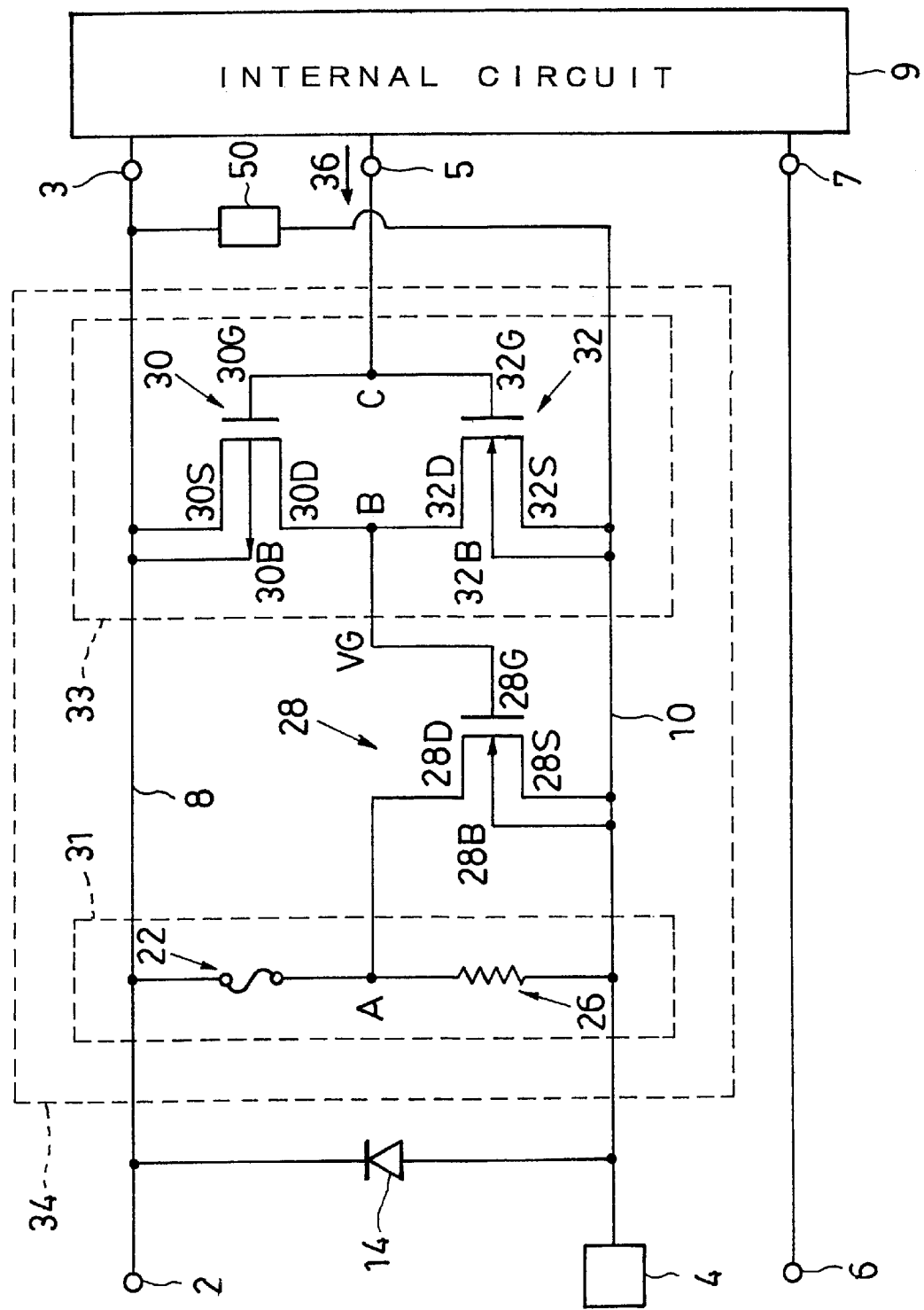
FIG. 1 is a circuit diagram showing an example of a semiconductor integrated circuit provided with a protection circuit according to the present invention.
Figure 9:
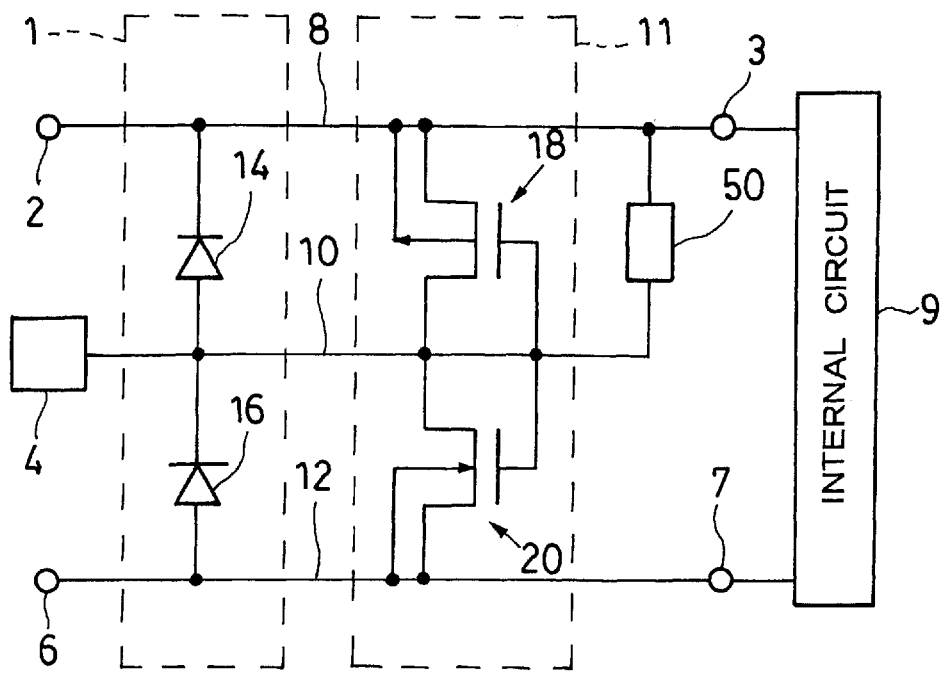
FIG. 9 is a circuit diagram showing an example of a semiconductor integrated circuit provided with a conventional protection circuit.
Figure 10:
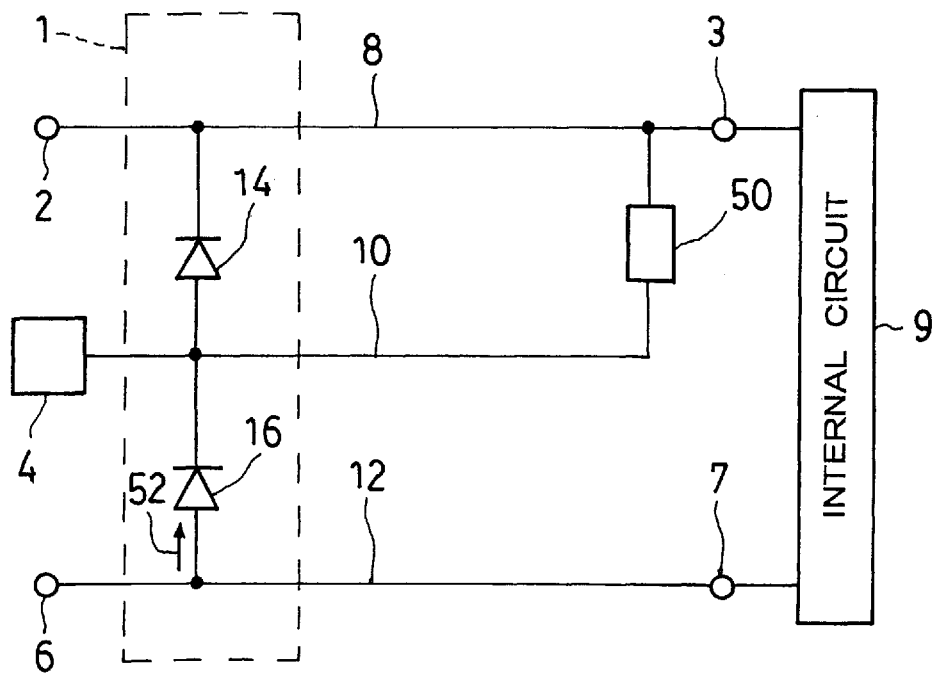
FIG. 10 is a circuit diagram showing another example of a semiconductor integrated circuit provided with a conventional protection circuit.

FIG. 1 is a circuit diagram showing an example of a semiconductor integrated circuit provided with a protection circuit according to the present invention. A protection circuit 34 is a circuit when a program voltage is of negative voltage. Incidentally, portions in FIG. 1 in common with the conventional protection circuit shown in FIG. 9 are assigned the same reference numerals as those in FIG. 9.

The protection circuit 34 is connected between a GND line 8 and a program voltage line 10 in parallel with a positive voltage protection diode 14 which is connected to be in a forward direction as viewed from a program voltage terminal 4, and comprises a first circuit portion 31, an N-type MOS transistor 28 and a second circuit portion 33.

The first circuit portion 31 is a circuit configured to pass a current generated by static electricity while suppressing it until a program voltage is applied to the program voltage terminal 4 and to be fused when the program voltage for writing into a memory device 50 is applied. The first circuit portion 31 is constituted by connecting one end of a fuse element 22 to the GND line 8 and connecting one end of a resistor 26 for current limitation to the program voltage line 10, and connecting between the other end of the fuse element 22 and the other end of the resistor 26 at a connection point A.

The fuse element 22 has durability (current-carrying capacity) at a level at which it is never fused against the current generated by static electricity, while when the program voltage is applied to the program voltage terminal 4, it is fused prior to the application. The details thereof will be explained later.

The N-type MOS transistor 28 is a semiconductor device for supplying the fuse element 22 with a current for fusing the fuse element 22 of the first circuit portion 31 to thereby break the connection to the GND line 8, and passes the current in the state of second breakdown described later to fuse the fuse element 22. In the N-type MOS transistor 28, its bulk 28B and source 28S are connected to the program voltage line 10, its drain 28D is connected to the connection point A between the fuse element 22 and the resistor 26, and its gate 28G is connected to a connection point B described later.

The second circuit portion 33 is a circuit for generating a gate voltage for gate control required for bringing the N-type MOS transistor 28 into a second breakdown state so that the N-type MOS transistor 28 supplies a current for the first circuit portion 31 to break the connection between the program voltage line 10 and the GND line 8.

In the second circuit portion 33, a source 30S and a bulk 30B of a P-type MOS transistor 30 for gate control are connected to the GND line 8, and a source 32S and a bulk 32B of an N-type transistor 32 for gate control are connected to the program voltage line 10.

Respective drains 30D and 32D of the P-type MOS transistor 30 and the N-type MOS transistor 32 are connected to each other at the connection point B and respective gates 30G and 32G are connected to each other at a connection point C.

The GND line 8 connects a GND terminal 2 at the ground potential and an input/output terminal 3 of an internal circuit 9. The program voltage line 10 connects the program voltage terminal 4 that is a pad to which the program voltage is applied and the memory device 50. An input/output terminal 5 of the internal circuit 9 is connected to the connection point C, and a control signal 36 described later is output from the input/output terminal 5. Further, a power supply voltage terminal 6 is connected to an input/output terminal 7 of the internal circuit 9. The memory device 50 is connected between the program voltage line 10 and the GND line 8.

Figure 6:
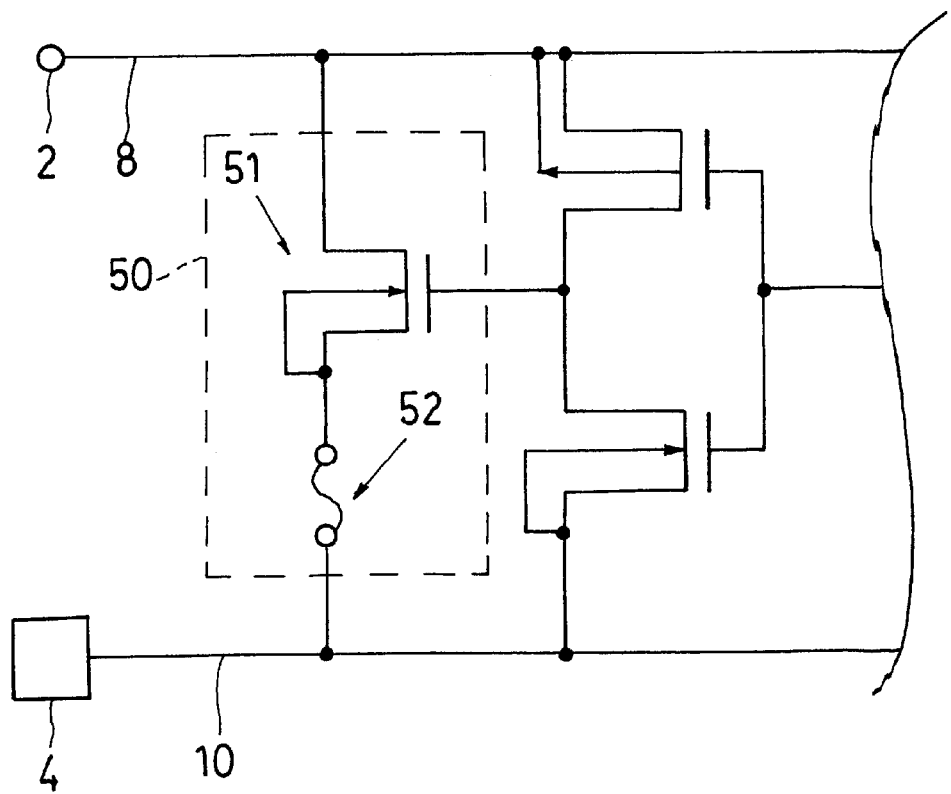
FIG. 6 is a circuit diagram showing an example of internal configuration of a memory device 50 shown in FIG. 1.

The memory device 50 is a fuse element breakdown-type memory device which requires current for writing thereinto. The memory 50 is, as shown in FIG. 6, constituted by connecting an N-type MOS transistor 51 and a fuse element 52 in series between the GND line 8 and the program voltage line 10, and information is written into the N-type MOS transistor 51.

The details of operation of the protection circuit 34 in FIG. 1 configured as described above will be explained next.

It is assumed that static electricity of positive voltage intrudes at the program voltage terminal 4 before the writing into the memory device 50.

At this time, the positive voltage protection diode 14 passes the static electricity through the GND line 8 to the GND terminal 2 by virtue of its forward characteristic. Since the fuse element 22 and the resistor 26 for current limitation are connected in series, the first circuit portion 31 serves as a resistor to the static electricity of positive voltage to pass the current generated by the intruding static electricity through the GND line 8 to the GND terminal 2.

Since the bulk 28B and the drain 28D form a path that an equivalent diode is connected in the forward direction, the N-type MOS transistor 28 forms a path for passing current in a direction from the program voltage line 10 toward the connection point A. It is conceivable, however, that the current generated by the intruding static electricity passes more through the positive voltage protection diode 14 to the GND terminal 2.

Through the second circuit portion 33, the current generated by the intruding static electricity hardly flows because the path composed of the P-type MOS transistor 30 and the N-type MOS transistor 32 serves as a resistor with a high resistance value.

Accordingly, as viewed in the protection circuit 34, the first circuit portion 31 functions of passing the largest amount of current of the static electricity of positive voltage which has intruded at the program voltage terminal 4.

It is assumed next that static electricity of negative voltage intrudes at the program voltage terminal 4.

At this time, since the positive voltage protection diode 14 exhibits a reverse direction characteristic to the static electricity of negative voltage, it does not pass current therethrough. Neither the N-type MOS transistor 28 passes current therethrough because the bulk 28B and the drain 28D form a path that an equivalent diode is connected in a reverse direction.

Since the fuse element 22 and the resistor 26 are connected in series, the first circuit portion 31 serves as a resistor also to the static electricity of negative voltage to pass a current generated by the intruding static electricity through the GND line 8 to the GND terminal 2. The resistor 26 suppresses the magnitude of the current flowing through the fuse element 22 at this time to prevent the fuse element 22 to be fused by the current generated by the static electricity.

Also in the second circuit portion 33, the current generated by the intruding static electricity hardly flows because the P-type MOS transistor 30 and the N-type MOS transistor 32 serve as a resistor with a high resistance value.

As described above, the protection circuit 34 normally operates to protect the internal circuit 9 in either case of the static electricity intruded at the program voltage terminal 4 being positive or negative.

The operation in the case in which a program voltage for writing into the memory device 50 is applied to the program voltage terminal 4 will be explained next.

Prior to the application of the program voltage, an operation for breaking the connection of the first circuit portion 31 serving as a by-pass to the GND line 8 is performed for the current generated by static electricity intruding at the program voltage terminal 4.

To this end, the gate voltage is applied from the second circuit portion 33 to the N-type MOS transistor 28 to bring the N-type MOS transistor 28 into a second breakdown state. This can fuse the fuse element 22, even in a state in which the voltage applied to the N-type MOS transistor 28 is low, by supplying a current at a level of fusing the fuse element 22 from the N-type MOS transistor 28 to the fuse element 22. After fusing the fuse element 22, the program voltage applied to the program voltage terminal 4 is applied to the memory device 50, thereby writing.

In this case, since the memory device 50 is written into only one time and thus is never written into again thereafter, there is no particular problem in writing into the memory device 50 even though the fuse element 22 is fused and N-type MOS transistor 28 is brought into the second breakdown state.

To bring the N-type MOS transistor 28 into the second breakdown state, a gate voltage VG is applied from the second circuit portion 33 to the gate 28G. The gate voltage VG is determined by the ratio between gate length and gate width of transistors between the P-type MOS transistor 30 and the N-type MOS transistor 32 of the second circuit portion 33. This point will be explained in detail hereinafter.

As described above, the second circuit portion 33 comprises the P-type MOS transistor 30 and the N-type MOS transistor 32, forming a circuit generally called an inverter. This second circuit portion 33 operates such that its output is reversed depending on whether the control signal 36 to be applied to the connection point C being at the ground potential or at the supply power voltage. It should be noted that the control signal 36 is a signal output from the internal circuit 9 to supply the gate voltage required for the N-type MOS transistor 28 to fuse the fuse element 22 of the first circuit portion 31 from the second circuit portion 33.

However, this operation is conducted when the program voltage terminal 4 is at the same voltage as the supply power voltage. When writing into the memory device 50, a voltage higher than the power supply voltage is applied to the program voltage terminal 4. At this moment, when the control signal 36 is at the power supply voltage, both the P-type MOS transistor 30 and the N-type MOS transistor 32 turn ON and serve as a resistor with a fixed resistance value.

In this state, a voltage at a value, which is obtained by dividing a voltage corresponding to a potential difference between the GND line 8 and the program voltage line 10 between the P-type MOS transistor 30 and the N-type MOS transistor 32, is output as the gate voltage VG to be supplied from the connection point B to the N-type MOS transistor 28. The value of the gate voltage VG is adjusted by adjusting the gate lengths and the gate widths of the P-type MOS transistor 30 and the N-type MOS transistor 32.

Figure 2:
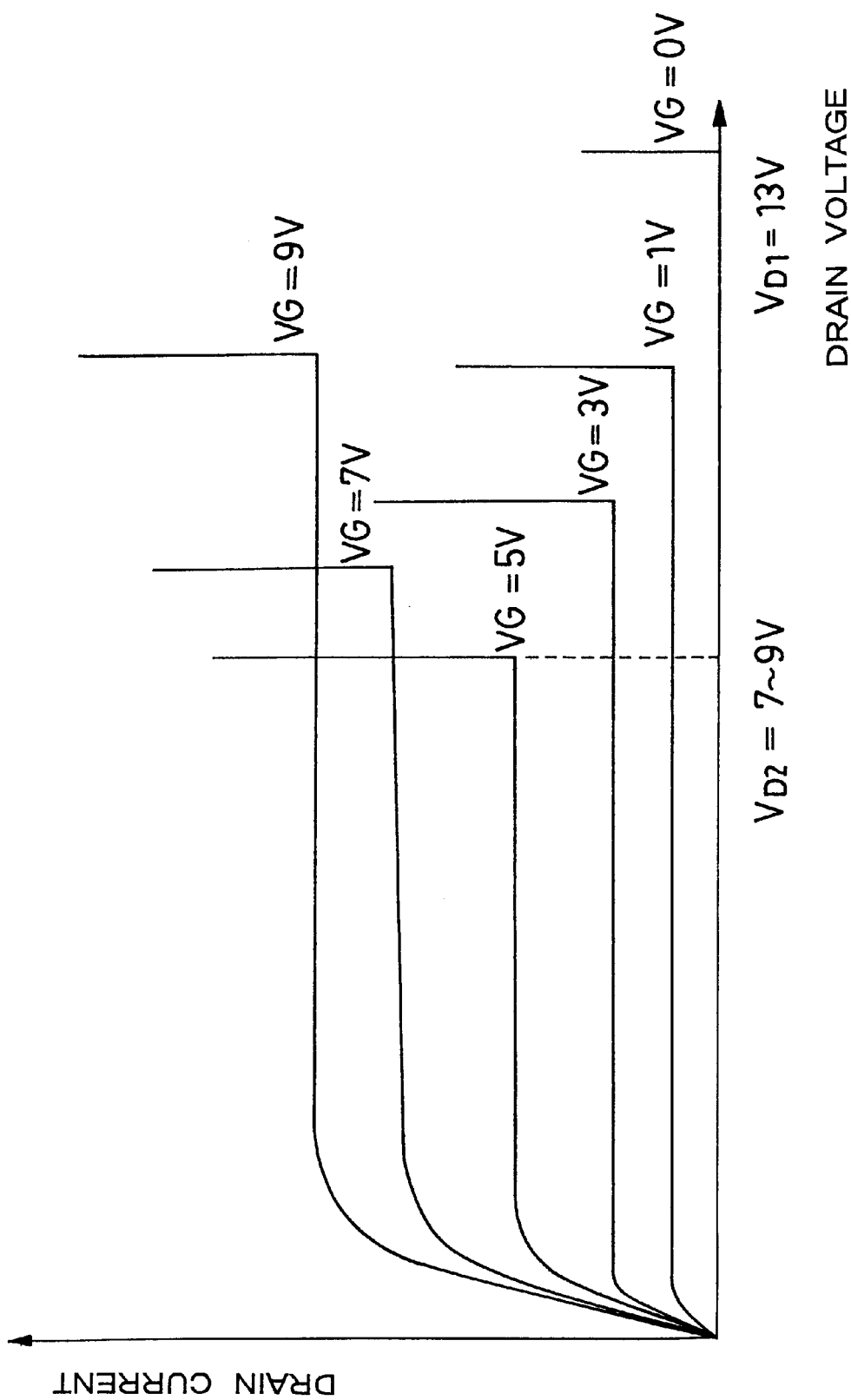
FIG. 2 is a diagram showing a characteristic of drain current and drain voltage of an N-type MOS transistor 28 shown in FIG. 1.

The second breakdown of the N-type MOS transistor 28 will be explained here using FIG. 2 to FIG. 4. FIG. 2 is a diagram showing a characteristic of drain current and drain voltage of the N-type MOS transistor 28, in which the vertical axis represents the drain current and the horizontal axis represents the drain voltage.

Figure 3:
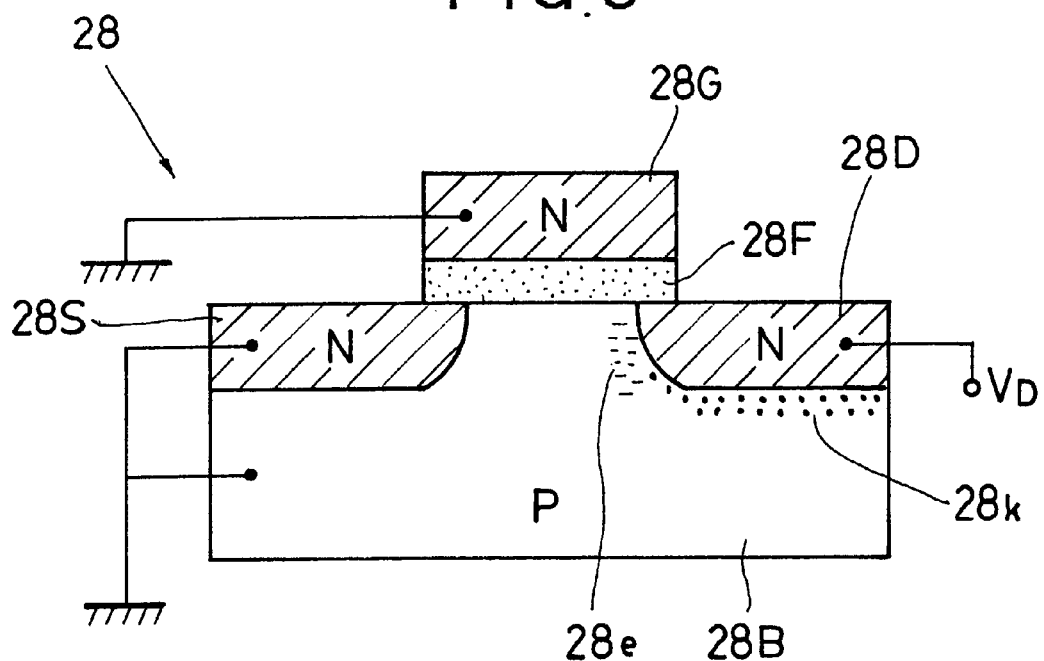
FIG. 3 is a schematic sectional view for explaining the operation of the same N-type MOS transistor 28 in a state in which a gate voltage is not applied.

In the N-type MOS transistor 28, as shown in FIG. 3, the drain 28D is composed of an N-type semiconductor, the bulk 28B is composed of a P-type, the source 28S is composed of an N-type, and the gate 28G is formed with a gate oxide film 28F interposed. Normally, the junction withstand voltage of the N-type MOS transistor 28 is determined by applying a positive voltage (drain voltage: VD) to the drain 28D and changing its value where the bulk 28B and the source 28S are connected and set at the ground potential and the voltage to be applied to the gate 28G is also set at the ground potential. In this event, the drain 28D and the bulk 28B exhibit a characteristic of a reverse junction to a PN junction.

As the drain voltage VD is increased, the width of a depletion layer 28k which is formed between the drain 28D and the bulk 28B increases and reaches a limit in the end. Then, electrons entered the depletion layer 28k accelerated by a drain electric field 28e which is formed in the vicinity of the depletion layer 28k, obtaining high energy. The electron which has obtained high energy collides with a crystalline lattice, generating an electron-hole pair, and if the electron generated (secondary electron) at that collision has gained energy, it again generates an electron-hole pair when colliding with a crystalline lattice.

The generation of electron-hole pair is repeated in chain as described above, causing a phenomenon that electrons are generated like an avalanche resulting in a sudden rise of current. This is called avalanche breakdown. In this event, the N-type MOS transistor 28 is in the OFF state of not operating because the gate voltage VG is not applied to the gate 28G. A drain voltage at which the avalanche breakdown can occur is called OFF withstand voltage (referred also to as drain withstand voltage), and an avalanche breakdown in the state in which the gate voltage VG is not applied is called first breakdown. Incidentally, the OFF withstand voltage VD1 is 13V (VG in this event is 0V) in FIG. 2.

In contrast to this, an avalanche breakdown occurring in the state in which the N-type MOS transistor 28 is in the ON state caused by applying the gate voltage VG to the gate 28G is called second breakdown. The principle of occurrence of this phenomenon is as follows.

Figure 4:
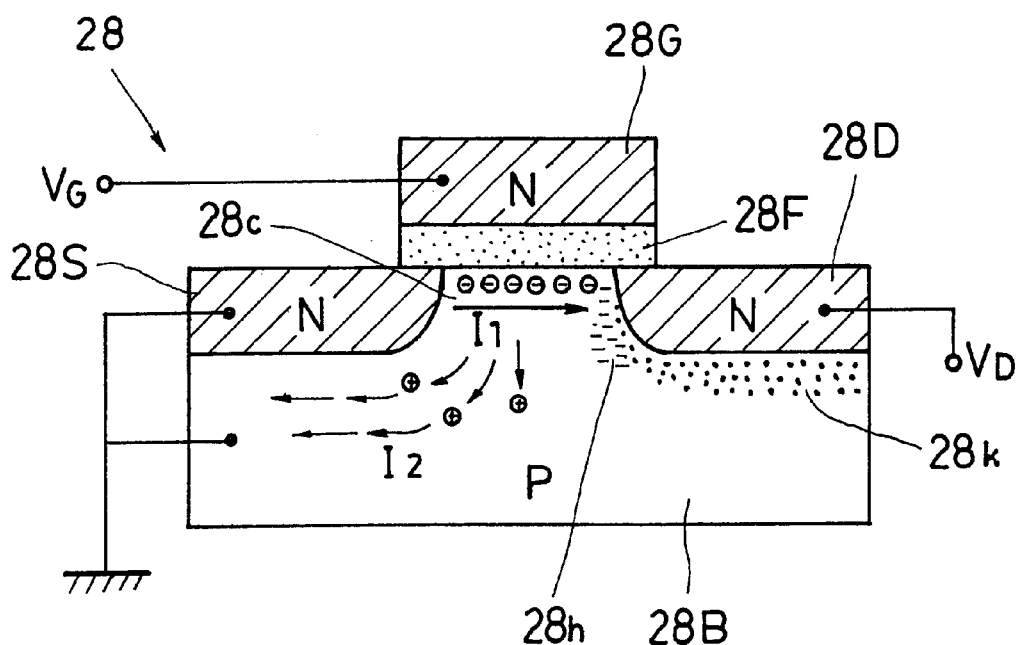
FIG. 4 is a schematic sectional view for explaining the operation of the same N-type MOS transistor 28 in a state in which a gate voltage is applied.

As shown in FIG. 4, when the gate voltage VG is applied to the gate 28G, a channel current I1 with electrons as carriers flows between the source 28S and the drain 28D. In this event, a region 28h which electric field strength is high is formed in the vicinity of the drain 28D. Since the electric field strength in the region 28h is high, electrons gain large energy by passing through the region 28h to be accelerated.

This electron which has gained large energy and been accelerated collides with a crystalline lattice existing in a channel 28c to generate an electron-hole pair. The hole generated at this time flows into the bulk 28B, whereby holes are accumulated in the bulk 28B. Incidentally, the flow of the holes into the bulk 28B leads to recognition of a substrate current I2. That the substrate current I2 flows means the formation of potential difference between the bulk 28B and the source 28S, which means that the PN junction composed of the bulk 28B and the source 28S is formed in a forward direction.

Then, the potential barrier existing between the bulk 28B and the source 28S gets lower, causing electrons to flow out of the source 28S to the bulk 28B, and further the potential barrier between the bulk 28B and the source 28S gets lower, resulting in increase of electrons flowing through the channel 28c. As described above, when the gate voltage is applied, the following cycle of ① to ⑥ (current generation cycle) occurs: ① generation of electrons caused by the channel current I1 ② acceleration of electrons caused by the region 28b high in electric field strength ③ generation of electron-hole pairs caused by the accelerated electrons ④ lowering of the electric barrier between the bulk 28B and the source 28S caused by the accumulation of the holes in the bulk 28B ⑤ flowing of the electrons out of the source 28S ⑥ further generation of electrons flowing through the channel 28c.

In this case, since the drain voltage VG is kept fixed, the state of occurrence of the current generation cycle corresponds, as viewed from the characteristic of the drain current and the drain voltage, to the state in which only the drain current increases with the drain voltage VD kept fixed.

The phenomenon of a sudden rise of the current flowing into the drain 28D by the current generation cycle as described above is called second breakdown because it is the breakdown with the gate voltage VG applied, and a drain voltage VD when the second breakdown occurs is called ON withstand voltage (it is also called sustain voltage). Incidentally, the ON withstand voltage VD2 is 7V to 9V (VG in this event is 5V) in FIG. 2.

This second breakdown is affected by the gate voltage VG, as shown in FIG. 2, because it can occur when the gate voltage VG is applied to the gate 28G to form the channel 28c, and the ON withstand voltage VD2 changes in accordance with the magnitude of the gate voltage VG. The N-type MOS transistor 28 in the case of occurrence of the second breakdown is applied with the gate voltage VG and the drain voltage VD.

On the other hand, the electrons move through the channel 28c shown in FIG. 4 gain energy from both of the gate electric field by the gate voltage VG and the drain electric field by the drain voltage VD, and too small drain electric field can not sufficiently accelerate the electrons, making electron-hole pairs less susceptible to be generated. In contrast, too large gate electric field weaken the strength of the electric field toward the drain direction to decrease energy for accelerating the electrons, also making electron-hole pairs less susceptible to be generated.

It is known that the minimum drain voltage (the ON withstand voltage VD2) at which the second breakdown occurs equals a gate voltage about half the drain voltage (the OFF withstand voltage VD1) at which the first breakdown occurs. As shown in FIG. 2, the drain voltage at which the first breakdown occurs is 13V and, in contrast, the minimum drain voltage VD2 (when VG=5V) at which the second breakdown occurs is 7V to 9V. In this event, the substrate current I2 is at the maximum.

In the protection circuit 34 shown in FIG. 1, the N-type MOS transistor 28 and the second circuit portion 33 are provided and the gate voltage VG is supplied from the second circuit portion 33 to the N-type MOS transistor 28 to thereby bring the N-type MOS transistor 28 into the second breakdown state as described above. Thereby, even a small size N-type MOS transistor 28 can obtain a current enough to break and fuse the fuse element 22.

Figure 5:
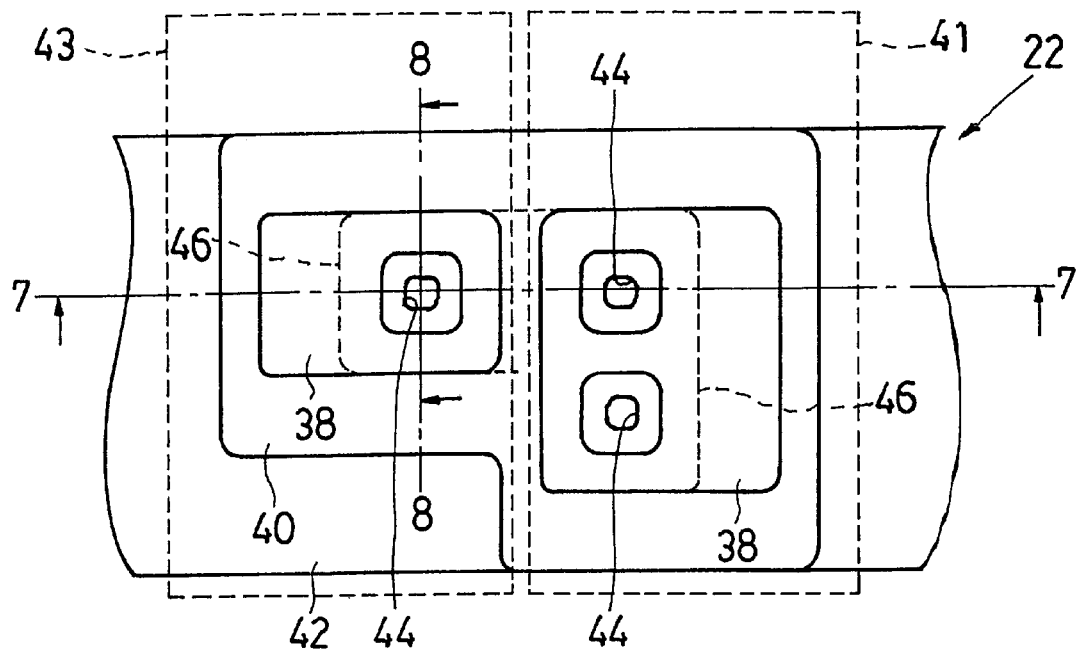
FIG. 5 is a plan view schematically showing an example of configuration of a fuse element 22 shown in FIG. 1.
Figure 7:
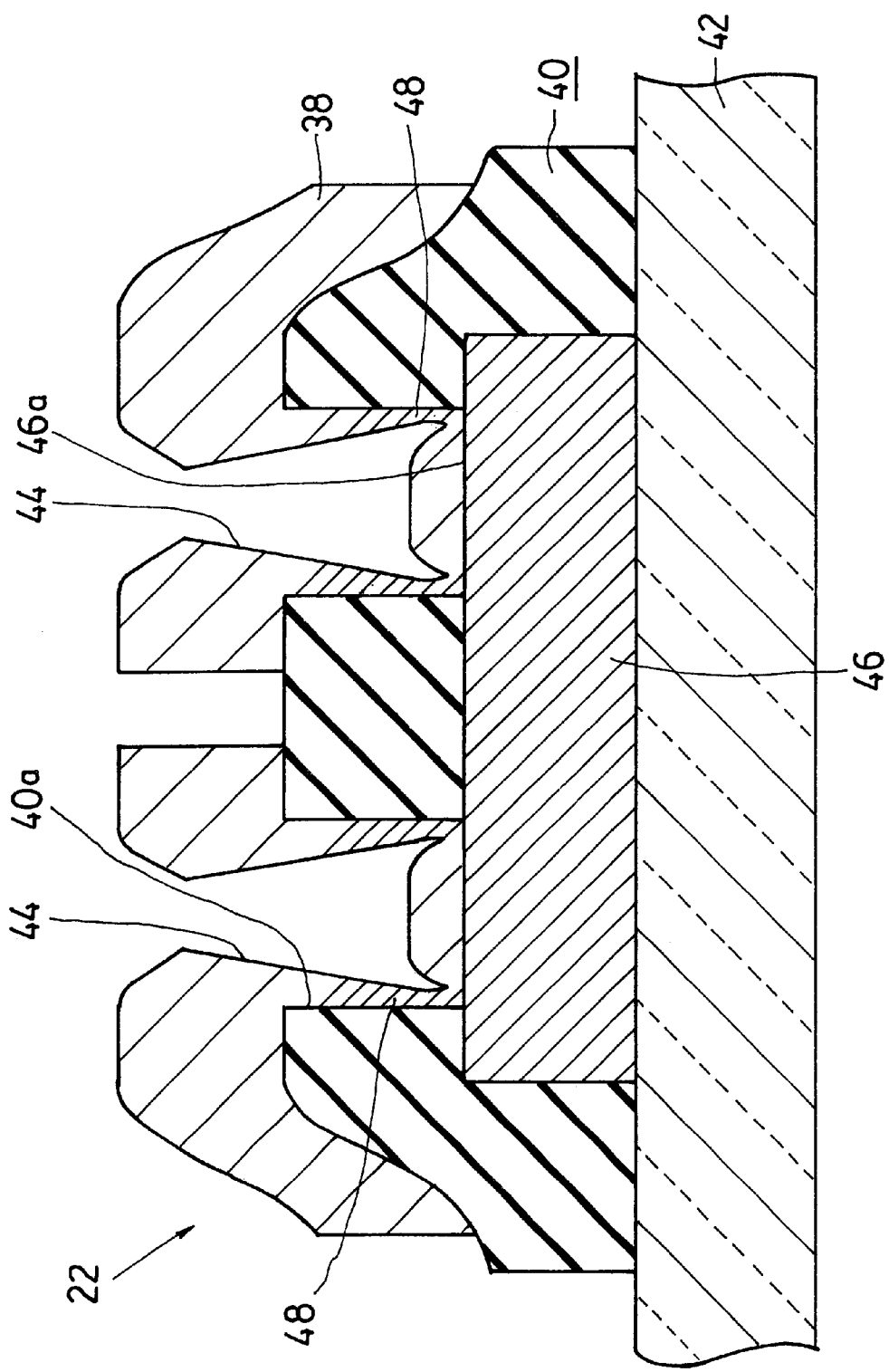
FIG. 7 is a schematic sectional view taken along line 7—7 in FIG. 5.

The fuse element 22 will be explained next using FIG. 5, FIG. 7 and FIG. 8. FIG. 5 is a plan view showing the configuration of the principal portion of the fuse element 22, FIG. 7 is an enlarged sectional view taken along line 7—7 in FIG. 5, and FIG. 8 is an enlarge sectional view taken along line 8—8 in FIG. 5.

The fuse element 22 comprises an input portion 41 and an output portion 43, in each of which a polycrystalline silicon film 46 is formed on the top face of a field oxide film 42 and an interlayer insulating film 40, which is provided with an opening portions 40a such that the top face of the polycrystalline silicon film 46 within each opening portion 40a is an exposed face 46a, is formed to cover the top face of the field oxide film 42. Further, a metal wiring film 38 is formed on the top face of the interlayer insulating film 40. The metal wiring film 38 is formed in contact with the top face of the interlayer insulating film 40 and the inner wall face of each opening portion 40a and the exposed face 46a of the polycrystalline silicon film 46, forming a contact hole 44 in each opening portion 40a.

The input portion 41 is a portion for inputting current thereinto from the outside and formed with two contact holes 44. The output portion 43 is a portion for outputting to the outside a current flowing thereinto from the input portion 41 and formed with only one contact hole 44.

Figure 8:
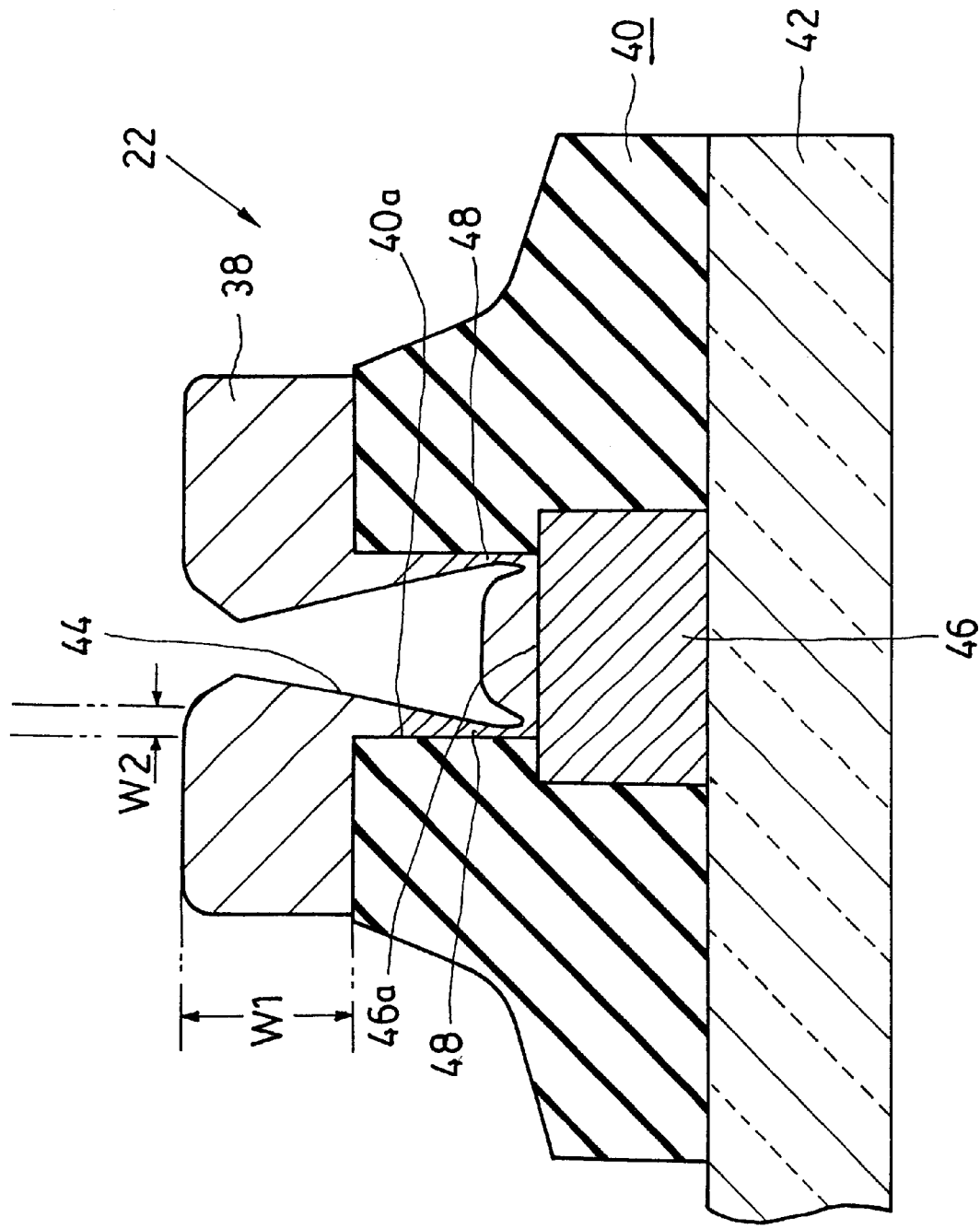
FIG. 8 is a schematic sectional view taken along line 8—8 in FIG. 5.

The metal wiring film 38 is formed through the use of a physical method such as a sputtering method to the front face of the interlayer insulating film 40, with the result that a film thickness W2 on the inner wall face of the opening portion 40a is thinner than a film thickness W1 on the outside (the top portion) of the interlayer insulating film 40 as shown in FIG. 8. Therefore, the metal wiring film 38 has a high resistance at a portion which is formed on the inner wall face of the opening portion 40a of the interlayer insulating film 40, forming a current concentration portion 48 (a portion with hatching at closer intervals in the drawing) which is necessary as the fuse element 22. This current concentration portion 48 is broken by a large current flowing therethrough. This fuses the fuse element 22.

When current is passed through the fuse element 22, the current through the metal wiring film 38 of the input portion 41 passes through the current concentration portions 48 in the two opening portions 40a and passes through the metal wiring film 38 and the polycrystalline silicon film 46 to input into the output portion 43. This results in the passage of the current through two opening portions 40a and thereafter one opening portion 40a, whereby the current is easy to concentrate at the current concentration portion 48 formed in the opening portion 40a of the output portion 43. Accordingly, the fuse element 22 has a configuration susceptible to fusion on the output portion 43 side.

Although the above-described fuse element 22 is formed with two contact holes 44 in the input portion 41, it is preferable to increase the number thereof to three or four, that is, to form two or more. That is because the formation causes a large current to flow into the input portion 41 and the current passes through the one contact hole 44 in the output portion 43, so that a larger current concentrates at the current concentration portion 48.

Other than the above, the fuse element may be formed of a polycrystalline silicon wiring film or a metal wiring film provided with a fusion area which is thin and has a high resistance value. Alternately, the fuse element may be formed of a polycrystalline silicon wiring film or a metal wiring film having a step portion in which a current concentration portion is formed.

Effect of the Invention

As is clear from the above description, the first circuit portion passes static electricity of either of positive voltage and negative voltage until the program voltage is input at the program voltage terminal, whereby the protection circuit for the semiconductor integrated circuit according to the present invention can operate normally even when static electricity of either positive voltage or negative voltage inputs thereinto, thereby protecting the internal circuit.

Moreover, when the program voltage is input at the program voltage terminal, a voltage is applied from the second circuit portion to the semiconductor device to cause a current for breaking the connection of the first circuit portion to flow from the semiconductor device to thereby break the connection of the first circuit portion, and then the program voltage is applied at the program voltage terminal. Then the program voltage is applied to the memory device, thereby normally writing.

What is claimed is:

1. A protection circuit, for a semiconductor integrated circuit, connected between a GND line connected to a GND terminal of the semiconductor integrated circuit and a program voltage line connected to a program voltage terminal for supplying a program voltage for writing into a memory, comprising:
   a first circuit portion for passing a current generated by static electricity until the program voltage is applied to said program voltage terminal, and for breaking a connection between said GND line and said program voltage line when the program voltage is applied;
   a semiconductor device for passing a current to said first circuit portion for breaking the connection between said GND line and said program voltage line; and
   a second circuit portion for applying a voltage to said semiconductor device so that said semiconductor device passes the current to said first circuit portion for breaking the connection between said GND line and said program voltage line.

2. A protection circuit for a semiconductor integrated circuit according to claim 1, wherein said first circuit portion is constituted by connecting a resistor for suppressing the current generated by static electricity and a fuse element in series between said GND line and said program voltage line.

3. A protection circuit for a semiconductor integrated circuit according to claim 2, wherein said fuse element is configured such that top of a polycrystalline silicon film is covered with an insulating film having an opening portion for exposing part of said polycrystalline silicon film, a metal wiring film is formed from the top of said insulating film to the inside of said opening portion, and said metal wiring film formed on an inner wall face of said opening portion becomes a current concentration portion with a high resistance value.

4. A protection circuit for a semiconductor integrated circuit according to claim 3, wherein said fuse element is formed such that said opening portion of said insulating film is formed divided into two sides, a side for inputting current thereinto and a side for outputting current, and the number of opening portions on the inputting side is two or more.

5. A protection circuit for a semiconductor integrated circuit according to claim 2, wherein said fuse element is composed of a metal wiring film provided with a fusion area which is thin and has a high resistance value.

6. A protection circuit for a semiconductor integrated circuit according to claim 2, wherein said fuse element is composed of a polycrystalline silicon wiring film having a step portion, and a current concentration portion easy to fuse is formed in said step portion.

7. A protection circuit for a semiconductor integrated circuit according to claim 2, wherein said semiconductor device is composed of an N-type MOS transistor for passing a current at a second breakdown to fuse said fuse element of said first circuit portion.

8. A protection circuit for a semiconductor integrated circuit according to claim 7, wherein said fuse element is configured such that top of a polycrystalline silicon film is covered with an insulating film having an opening portion for exposing part of said polycrystalline silicon film, a metal wiring film is formed from the top of said insulating film to the inside of said opening portion, and said metal wiring film formed on the inner wall face of said opening portion becomes a current concentration portion with a high resistance value.

9. A protection circuit for a semiconductor integrated circuit according to claim 7, wherein said fuse element is composed of a metal wiring film provided with a fusion area which is thin and has a high resistance value.

10. A protection circuit for a semiconductor integrated circuit according to claim 7, wherein said fuse element is composed of a polycrystalline silicon wiring film having a step portion, and a current concentration portion easy to fuse is formed in said step portion.

11. A protection circuit for a semiconductor integrated circuit according to claim 7, wherein said second circuit portion is configured to supply a gate of said N-type MOS transistor with a gate voltage for said N-type MOS transistor to pass the current at the second breakdown.

12. A protection circuit for a semiconductor integrated circuit according to claim 11, wherein said fuse element is configured such that top of a polycrystalline silicon film is covered with an insulating film having an opening portion for exposing part of said polycrystal line silicon film, a metal wiring film is formed from the top of said insulating film to the inside of said opening portion, and said metal wiring film formed on the inner wall face of said opening portion becomes a current concentration portion with a high resistance value.

13. A protection circuit for a semiconductor integrated circuit according to claim 11, wherein said fuse element is composed of a metal wiring film provided with a fusion area which is thin and has a high resistance value.

14. A protection circuit for a semiconductor integrated circuit according to claim 11, wherein said fuse element is composed of a polycrystalline silicon wiring film having a step portion, and a current concentration portion easy to fuse is formed in said step portion.

15. A protection circuit for a semiconductor integrated circuit according to claim 11, wherein said second circuit portion is constituted by connecting a P-type MOS,transistor and an N-type MOS transistor in series between said GND line and said program voltage line, so that a voltage obtained by dividing a voltage between said GND line and said program voltage line by said P-type MOS transistor and said N-type MOS transistor is taken as said gate voltage.

16. A protection circuit for a semiconductor integrated circuit according to claim 15, wherein said fuse element is configured such that top of a polycrystalline silicon film is covered with an insulating film having an opening portion for exposing part of said polycrystalline silicon film, a metal wiring film is formed from the top of said insulating film to the inside of said opening portion, and said metal wiring film formed on the inner wall face of said opening portion becomes a current concentration portion with a high resistance value.

17. A protection circuit for a semiconductor integrated circuit according to claim 15, wherein said fuse element is composed of a metal wiring film provided with a fusion area which is thin and has a high resistance value.

18. A protection circuit for a semiconductor integrated circuit according to claim 15, wherein said fuse element is composed of a polycrystalline silicon wiring film having a step portion, and a current concentration portion easy to fuse is formed in said step portion.

* * * * *

UNITED STATES PATENT AND TRADEMARK OFFICE
CERTIFICATE OF CORRECTION

PATENT NO.   : 6,404,017 B1
DATED        : June 11, 2002
INVENTOR(S)  : Takizawa et al.

Page 1 of 1

It is certified that error appears in the above-identified patent and that said Letters Patent is hereby corrected as shown below:

Drawings,
Sheet 7 of 7

"

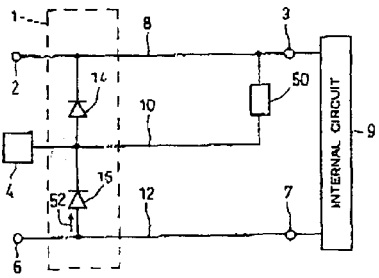

should be
--

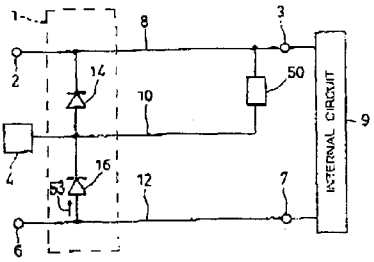

--

Signed and Sealed this

Twenty-seventh Day of May, 2003

JAMES E. ROGAN
*Director of the United States Patent and Trademark Office*